(12) United States Patent
Ho et al.

(10) Patent No.: US 6,860,731 B2
(45) Date of Patent: Mar. 1, 2005

(54) MOLD FOR ENCAPSULATING A SEMICONDUCTOR CHIP

(75) Inventors: Shu Chuen Ho, Singapore (SG); Teng Hock Kuah, Singapore (SG); Man Ho Hui, Singapore (SG); Srikanth Narasimulau, Singapore (SG); Murali Sarangapani, Singapore (SG)

(73) Assignee: ASM Technology Singapore PTE Ltd., Singapore (SG)

( * ) Notice: Subject to any disclaimer, the term of this patent is extended or adjusted under 35 U.S.C. 154(b) by 0 days.

(21) Appl. No.: 09/901,517

(22) Filed: Jul. 9, 2001

(65) Prior Publication Data

US 2003/0006529 A1 Jan. 9, 2003

(51) Int. Cl.$^7$ .................................................. B29C 45/14
(52) U.S. Cl. ...................... 425/112; 425/116; 425/125; 425/127; 425/129.1; 425/556; 264/272.15
(58) Field of Search .................................. 425/556, 116, 425/112, 127, 129.1, 125; 264/272.15

(56) References Cited

U.S. PATENT DOCUMENTS

| | | | | |
|---|---|---|---|---|
| 4,044,984 A | * | 8/1977 | Shimizu et al. | 425/127 |
| 4,697,784 A | * | 10/1987 | Schmid | 425/127 |
| 5,059,105 A | * | 10/1991 | Baird | 425/116 |
| 5,779,958 A | * | 7/1998 | Nishihara et al. | 264/272.15 |
| 5,997,798 A | * | 12/1999 | Tetreault et al. | 264/272.15 |
| 6,019,588 A | * | 2/2000 | Peters et al. | 264/272.15 |
| 6,193,493 B1 | * | 2/2001 | Steijer et al. | 425/127 |
| 6,435,855 B1 | * | 8/2002 | Sakurai | 425/556 |

* cited by examiner

*Primary Examiner*—Tim Heitbrink
(74) *Attorney, Agent, or Firm*—Ostrolenk, Faber, Gerb & Soffen, LLP

(57) ABSTRACT

A mold has two mold halves (6, 7). One of the mold halves (6) includes a contact section (8) which is adapted to contact a surface (5) of a semiconductor chip (1) mounted in the mold, in use.

5 Claims, 1 Drawing Sheet

MOLD FOR ENCAPSULATING A SEMICONDUCTOR CHIP

FIELD OF THE INVENTION

The invention relates to a mold, and especially, a mold for molding an encapsulating material around a semiconductor chip.

SUMMARY OF THE INVENTION

In accordance with first aspect of the present invention, there is provided a mold comprising two mold halves, one of the mold halves comprising a contact section which is adapted to contact a surface of a semiconductor chip mounted in the mold, in use.

In accordance with another aspect of the present invention, there is provided a method of molding material around a semiconductor chip, the method comprising mounting the semiconductor chip on a substrate, inserting the substrate and semiconductor chip into a mold, such that a contact section of the mold contacts a surface of the chip, molding the molding material around the semiconductor chip and the contact section to form a molded package, and subsequently removing the molded package from the mold.

An advantage of the invention is that by providing a mold with a portion which contacts a surface of the semiconductor chip, it is possible to prevent molding material from covering the semiconductor chip where the portion of the mold contacts the semiconductor chip. This is especially useful where it is desirable to leave a surface of the semiconductor chip, or a portion of a surface, free of molding material.

Preferably, the contact section of the mold, which is adapted to engage with the surface of the semiconductor chip, is in the form of a removable member which is mounted on one of the mold halves, and extends which an open passage or aperture therein. Preferably, the removable member is mounted for movement relative to the mold half on which it is mounted.

Preferably, the mold further comprises biasing means to bias the member into a mold cavity defined by the mold halves.

In one example of the invention, the contact section comprises a compressible material, such as rubber or an elastomeric material.

Typically, the surface of the contact section, which is adapted to contact the surface of a semiconductor chip is use, may be profiled to minimise seepage of molding material between the section of the mold and the surface of the semiconductor chip during molding.

Typically, the surface of the chip contacted by the contact section may be an active surface or a non-active surface of the chip.

BRIEF DESCRIPTION OF THE DRAWINGS

Examples of a mold in accordance with the invention will now be described with reference to the accompanying drawings, in which.

DESCRIPTION OF PREFERRED EMBODIMENTS

Figures 1A, 1B:
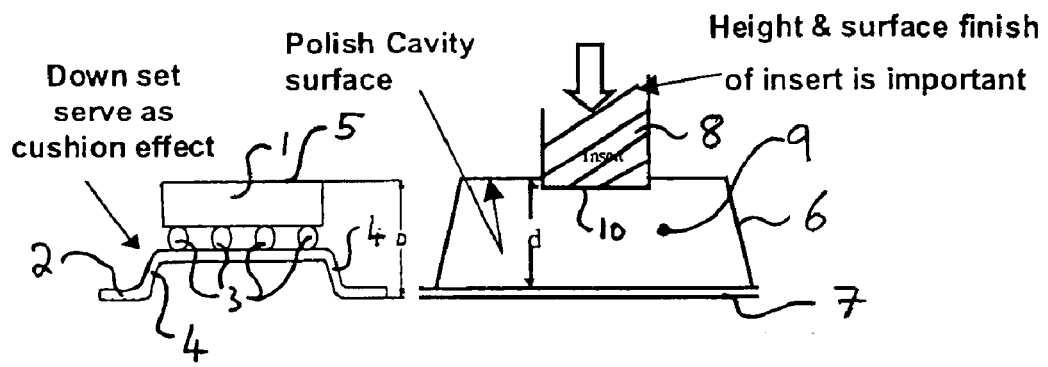
FIG. 1A is a cross-sectional view of a semiconductor chip mounted on a substrate.
FIG. 1B is a cross-sectional view of a first example of a mold having an insert for molding an encapsulating material around the semiconductor chip and substrate shown in FIG. 1A.

FIG. 1A shows a flip chip type semiconductor chip 1 which is electrically and physically connected to a substrate 2 by solder bumps 3 formed on bond pads (not shown) on the active surface of the chip 1. The chip 1 and solder bumps 3 are connected to the substrate 2 using a conventional solder reflow process. It will be noted that the substrate 2 has two bent sections 4. The bent sections 4 introduce flexibility to the substrate 2 so that if a force is applied to top surface 5 of the chip 1 the substrate 2 flexes at the bent sections 4 so that the force on the surface 5 moves the chip 1 downwards.

FIG. 1B shows a mold which comprises an upper mold half 6 and a lower half 7, which define a mold cavity 9. An insert 8 may be inserted through an aperture, i.e., an open passage in the upper mold half 6 so that surface 10 of the insert 8 enters the mold cavity 9. The mold cavity 9 has a distance "d" between the upper surface of the upper mold half 6 and the lower surface of the lower mold half 7. This dimension "d; is equal to the height "D" between the substrate 2 and the surface 5 of the chip 1, as shown in FIG. 1A. When the semiconductor chip 1 and substrate 2 are inserted into the mold and the upper mold half is closed onto the lower mold half 7, the surface 10 of the insert 8 engages with the surface 5 of the chip 1 and as the mold halves 6, 7 are clamped shut, the force exerted by the insert 8 on the surface 5 causes the substrate 2 to flex at the bent section 4 so that the semiconductor chip 1 is pushed downwards in the mold cavity 9 by the insert 8. This downward force exerted by the insert 8 acts to generate a sealing pressure between the surface 10 and the surface 5 so that when molding material is injected into the mold cavity 9, the molding material molds around the semiconductor chip 1, the substrate 2 and solder bumps 3 but seepage of molding material between the surfaces 5, 10 is minimised. Hence, when the molded product is removed from the mold, the portion of the surface 5 which has been contacted by the surface 10 is free of molding material and so the portion of the surface 5 which has been contacted by the surface 10 is exposed.

Figure 2:
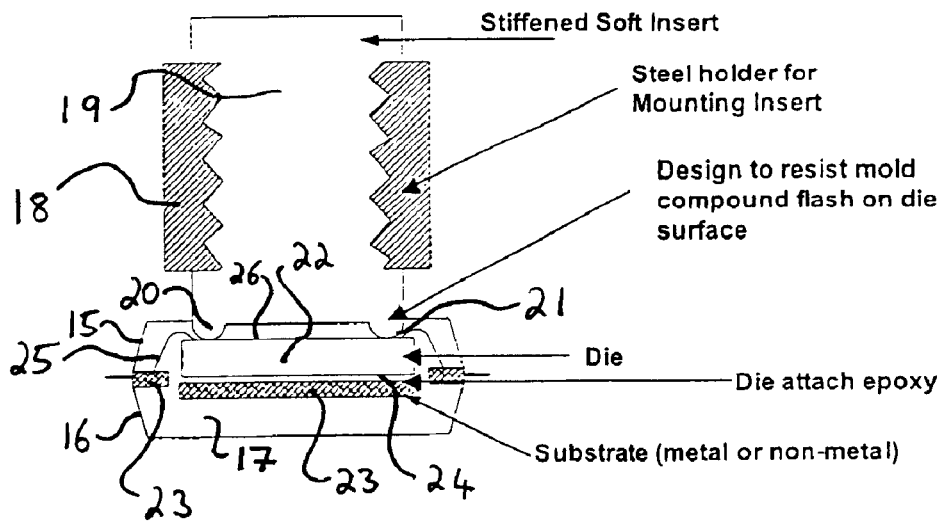
FIG. 2 is a cross-sectional view of a second example of a mold having an insert with a semiconductor chip and substrate located within the mold.

FIG. 2 shows a second example of a mold which comprises an upper mold half 15 and a lower mold half 16 which define a mold cavity 17. An insert 19 may be inserted through an aperture or open passage in the upper mold half 15 so that a lower end 20 is located within the mold cavity 17. The lower end 20 comprises a profiled edge 21 which extends along the outside of the lower end 20 and engages with a surface 26 of a semiconductor chip 22 located in the mold cavity 17. A steel holder 18 encircles the insert 19 and provides a means to enable the insert 19 to be mounted on the mold.

The semiconductor chip 22 is mounted on a substrate 23 (which may be metal or non-metal) by a layer of die attach epoxy 24. Wire bonds 25 extend between bond pads (not shown) on the surface 26 of the chip 22 and electrical contact zones on the substrate 23.

The insert 19 is manufactured from a compressible material so that when the mold halves 15, 16 are closed, edge 21 of the insert compresses onto the surface 26 of the die 22 to minimise seepage of molding material between the surface 26 and the edge 21 with the section of the surface 26 located between the edges 21 is not covered by molding material.

Therefore, when the chip 22 and substrate 23 are removed from the mold after a molding operation, the surface 26 covered by the insert 19 is free from molding material and is exposed.

Figure 3:
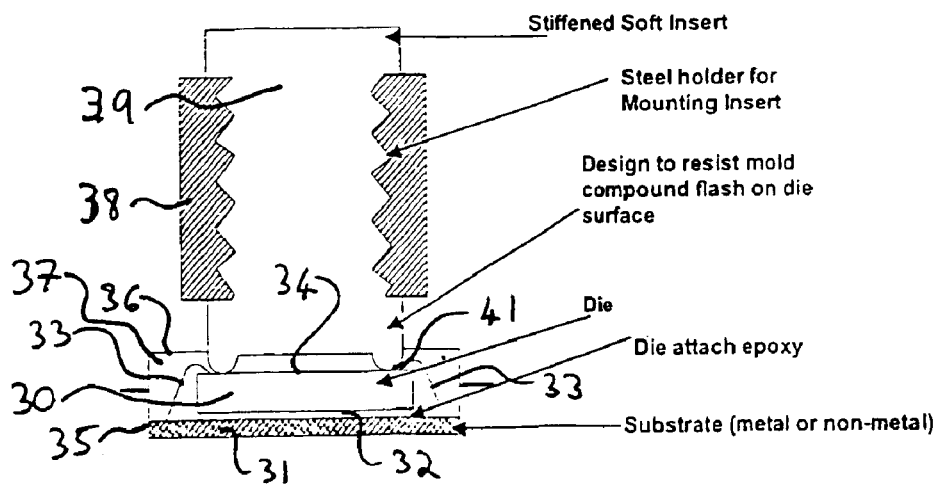
FIG. 3 is a cross-sectional view of a third example of a mold having an insert with a semiconductor chip and substrate shown located within the mold.

FIG. 3 shows a third example of a mold comprising mold halves 35, 36 which define a mold cavity 37. The mold uses an insert 39 with a metal holder 38 which are similar to the insert 19 and holder 18 shown in FIG. 2. However, in this instance, a semiconductor chip 30 is mounted on a flat substrate 31 by a layer of die attach epoxy 32 and wire bonds 33 extend between bond pads (not shown) on surface 34 of the chip 30 and corresponding electrical contact areas on the substrate 31. In this example, the substrate 31 (which may be metal or non-metal) lies on the lower surface of the lower mold half 35 so that when mold halves 35, 36 are closed, the insert 39 presses against the upper surface 34 of the chip 30 and the substrate 31 is pressed against the lower mold half 35.

Hence, when molding material is injected into the mold cavity 37 defined by the mold halves 35, 36, the molding material is prevented from covering the surface 34 of the chip 30 by the edges 41 of the insert 39 and is prevented from covering the lower side of the substrate 31 by the fact that the lower side of the substrate 31 is pressed against the lower side of the lower mold half 35.

Hence, the invention has the advantage of permitting semiconductor chips to be encapsulated with a molding material while leaving a portion of a surface of the semiconductor chip free from molding material so that it is exposed. For example, it may be desirable to leave a surface of a semiconductor chip exposed for cooling reasons, or if the semiconductor chip forms a pressure or temperature sensor and the exposed part of the surface is the sensing portion of the chip.

We claim:

1. A mold comprising:

two mold halves, the mold including portions configured to define the shape of a cavity which receives molding material for encapsulating a semiconductor chip;

one of the mold halves including an aperture extending therethrough:

a removable contact member formed of a compressible material, the contact member being movably mounted on one of the mold halves and positioned in the aperture;

the contact member being so shaped and positioned that it is in contact with a surface of a semiconductor chip being encapsulated in the mold; and an element operative to bias the removable member into the mold cavity defined by the mold halves.

2. A mold comprising:

two mold halves, the mold including portions configured to define the shape of a cavity which receives molding material for encapsulating a semiconductor chip;

one of the mold halves including an an open passage extending therethrough; and a contact member formed of a compressible material, and positioned in the open passage;

the contact member being so shaped and positioned that it is in contact with a surface of a semiconductor chip being encapsulated in the mold.

3. A mold according to claim 2, wherein the contact member of the mold which is adapted to engage with the surface of the semiconductor chip, is in the form of a removable member which is mounted on one of the mold halves.

4. A mold according to claim 3, wherein the removable member is mounted for movement relative to the mold half on which it is mounted.

5. A mold comprising:

two mold halves, the mold including portions configured to define the shape of a cavity which receives molding material for encapsulating a semiconductor chip;

one of the mold halves including an open passage extending therethrough and a contact member positioned in the open passage;

the contact member being so shaped and positioned that a portion thereof is in contact with a portion of the surface of a semiconductor chip being encapsulated in the mold, and wherein the portion of the contact member which is in contact with the portion of the surface of the semiconductor chip is so profiled as to minimize seepage of molding material onto the portion of the surface of the semiconductor chip during molding.

* * * * *

UNITED STATES PATENT AND TRADEMARK OFFICE
CERTIFICATE OF CORRECTION

PATENT NO.      : 6,860,731 B2
DATED           : March 1, 2005
INVENTOR(S)     : Shu Chuen Ho et al.

It is certified that error appears in the above-identified patent and that said Letters Patent is hereby corrected as shown below:

Title page,
Item [75], Inventors, should read
-- Shu Chuen Ho, Singapore (SG); Teng Hock Kuah, Singapore (SG); Man Ho Hui, Singapore (SG); Srikanth Narasimalu, Singapore (SG); Murali Sarangapani, Singapore (SG). --

Signed and Sealed this

Thirty-first Day of May, 2005

JON W. DUDAS
*Director of the United States Patent and Trademark Office*